United States Patent
Singer et al.

(10) Patent No.: US 10,103,296 B2
(45) Date of Patent: Oct. 16, 2018

(54) METHOD FOR PRODUCING OPTOELECTRONIC SEMICONDUCTOR DEVICES AND AN OPTOELECTRONIC SEMICONDUCTOR DEVICE

(71) Applicant: OSRAM Opto Semiconductors GmbH, Regensburg (DE)

(72) Inventors: Frank Singer, Regenstauf (DE); Britta Goeoetz, Regensburg (DE); David Racz, Regensburg (DE); Matthias Sperl, Mintraching (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 0 days.

(21) Appl. No.: 15/515,766

(22) PCT Filed: Oct. 1, 2015

(86) PCT No.: PCT/EP2015/072674
§ 371 (c)(1),
(2) Date: Mar. 30, 2017

(87) PCT Pub. No.: WO2016/050903
PCT Pub. Date: Apr. 7, 2016

(65) Prior Publication Data
US 2017/0301835 A1    Oct. 19, 2017

(30) Foreign Application Priority Data
Oct. 2, 2014    (DE) .................. 10 2014 114 372

(51) Int. Cl.
*H01L 33/54*    (2010.01)
*H01L 33/50*    (2010.01)
(Continued)

(52) U.S. Cl.
CPC ............ *H01L 33/54* (2013.01); *H01L 33/486* (2013.01); *H01L 33/502* (2013.01);
(Continued)

(58) Field of Classification Search
None
See application file for complete search history.

(56) References Cited

U.S. PATENT DOCUMENTS 8,592,232 B2    11/2013    Suh et al.
8,723,198 B2    5/2014    Brunner et al.
(Continued)

FOREIGN PATENT DOCUMENTS

DE    102007049005 A1    3/2009
DE    102009036621 A1    2/2011
(Continued)

*Primary Examiner* — Whitney T Moore
(74) *Attorney, Agent, or Firm* — Slater Matsil, LLP

(57) ABSTRACT

A method for producing optoelectronic semiconductor devices and an optoelectronic semiconductor device are disclosed. In an embodiment, the method includes providing a plurality of semiconductor chips for producing electromagnetic radiation, arranging the plurality of semiconductor chips in a plane, forming a housing body composite, at least some regions of which are arranged between the semiconductor chips, forming a plurality of conversion elements, wherein each conversion element comprises a wavelength-converting conversion material and is arranged on one of the semiconductor chips, encapsulating the plurality of conversion elements at least on their lateral edges by an encapsulation material, and separating the housing body composite into a plurality of optoelectronic semiconductor components.

15 Claims, 7 Drawing Sheets

(51) Int. Cl.
*H01L 33/48* (2010.01)
*H01L 33/62* (2010.01)
*H01L 33/56* (2010.01)

(52) U.S. Cl.
CPC ............ *H01L 33/505* (2013.01); *H01L 33/56* (2013.01); *H01L 33/62* (2013.01); *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 9,373,759 B2 | 6/2016 | Wilm | |
| 9,490,396 B2 | 11/2016 | Weidner et al. | |
| 2005/0161813 A1* | 7/2005 | Pammer | H01L 33/62 257/737 |
| 2005/0269591 A1* | 12/2005 | Hsin Chen | H01L 33/641 257/99 |
| 2010/0258830 A1* | 10/2010 | Ide | H01L 33/60 257/98 |
| 2010/0276706 A1* | 11/2010 | Herrmann | H01L 33/0079 257/89 |
| 2011/0049545 A1 | 3/2011 | Basin et al. | |
| 2011/0217530 A1 | 9/2011 | Maier-Richter et al. | |
| 2012/0061703 A1 | 3/2012 | Kobayashi | |
| 2013/0026518 A1 | 1/2013 | Suh et al. | |
| 2013/0240829 A1* | 9/2013 | Kuramachi | H01L 21/02458 257/9 |
| 2014/0042481 A1 | 2/2014 | Inoue et al. | |
| 2014/0091334 A1* | 4/2014 | Katayama | H01L 33/0095 257/88 |
| 2015/0236223 A1 | 8/2015 | Moosburger | |
| 2016/0053949 A1 | 2/2016 | Zehetner et al. | |

FOREIGN PATENT DOCUMENTS

| | | |
|---|---|---|
| DE | 102012111123 A1 | 3/2014 |
| DE | 102012216738 A1 | 3/2014 |
| DE | 202013101431 U1 | 7/2014 |
| EP | 2221885 A1 | 8/2010 |
| EP | 2511963 A2 | 10/2012 |
| JP | 2006114909 A | 4/2006 |
| JP | 2008546877 A | 12/2008 |
| JP | 2009161642 A | 7/2009 |
| JP | 2011066193 A | 3/2011 |
| JP | 2013251417 A | 12/2013 |
| JP | 2014507804 A | 3/2014 |
| JP | 2014110333 A | 6/2014 |
| JP | WO2012144030 A1 | 7/2014 |
| WO | 2010025849 A1 | 3/2010 |

* cited by examiner

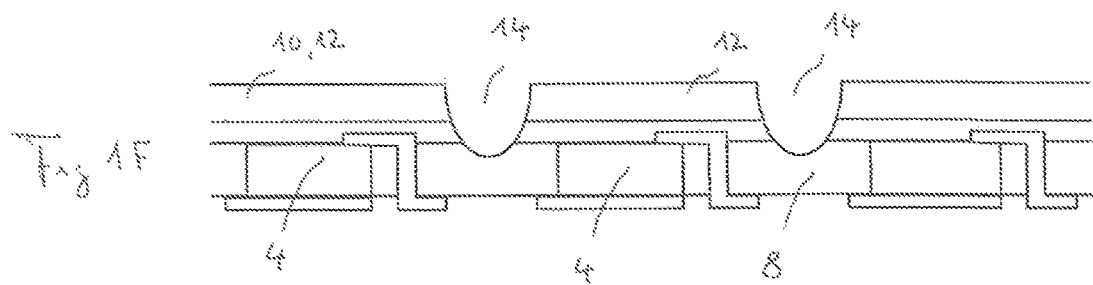
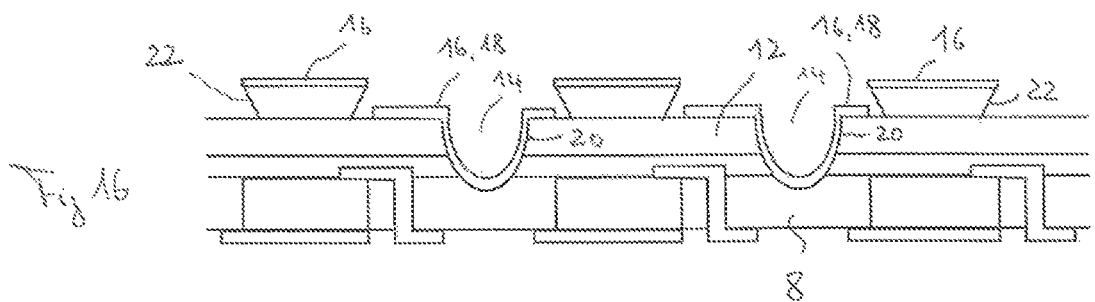
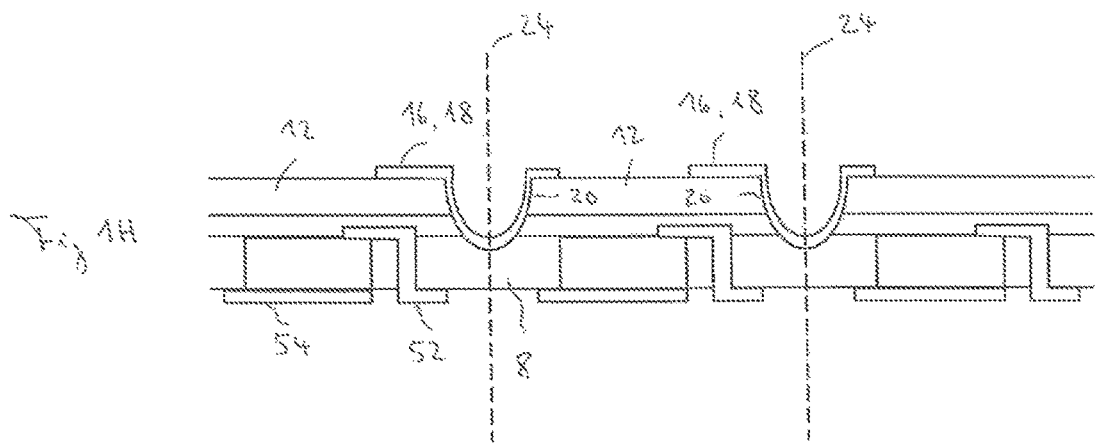
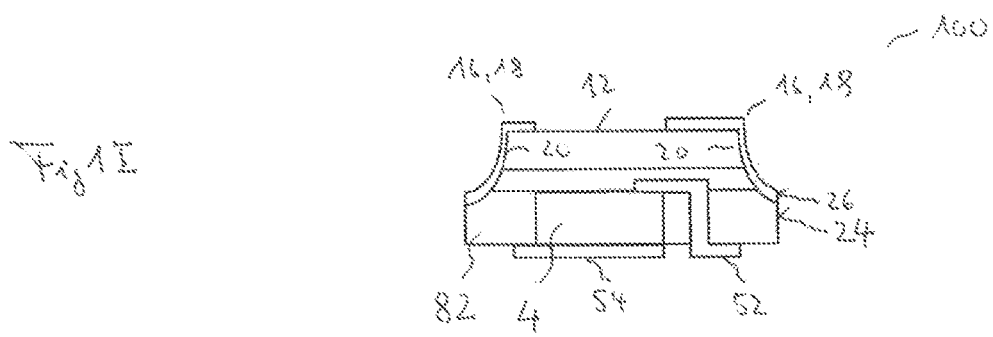

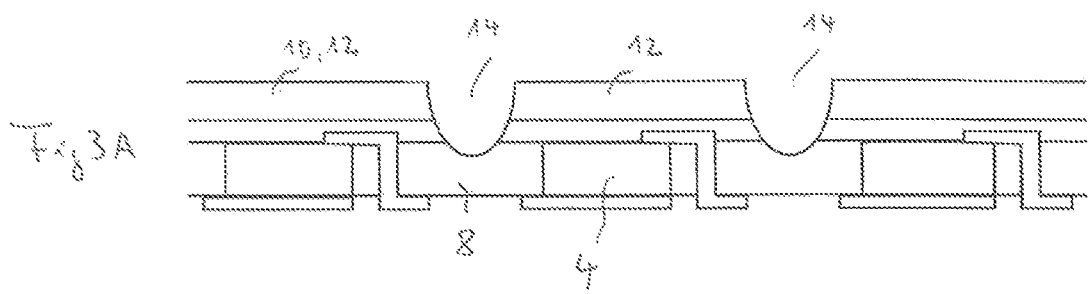
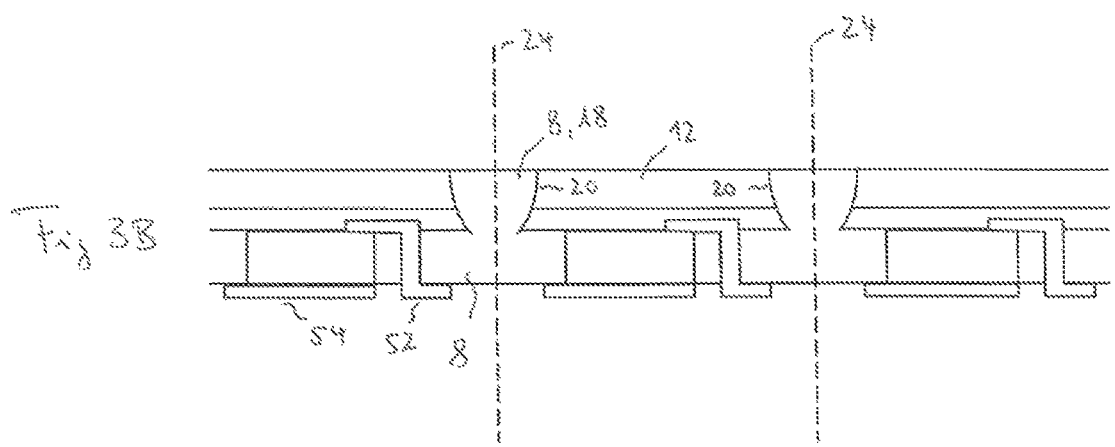
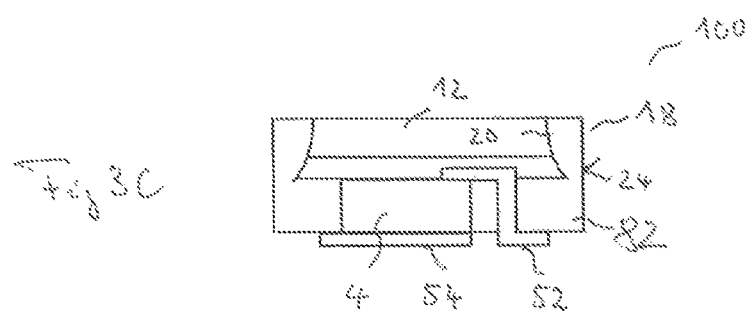

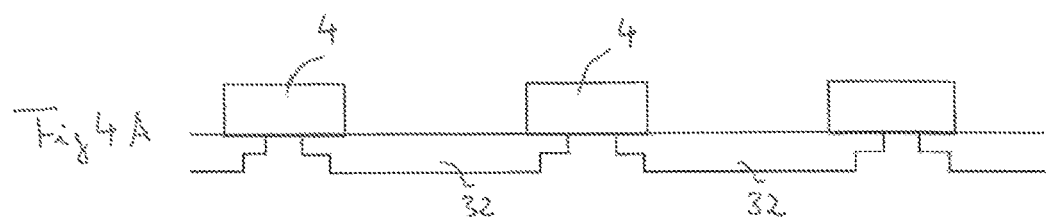
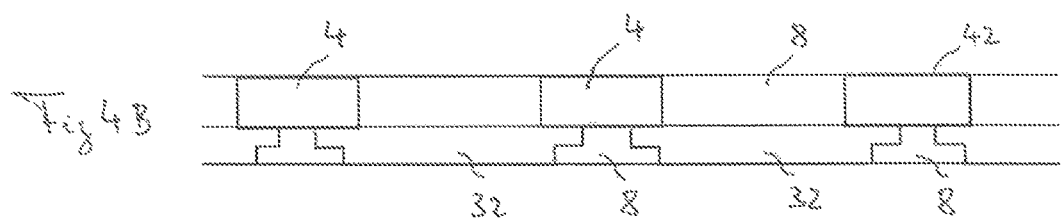
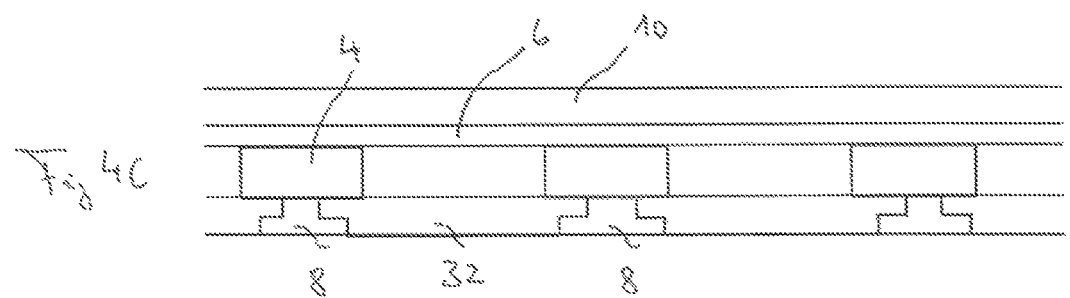
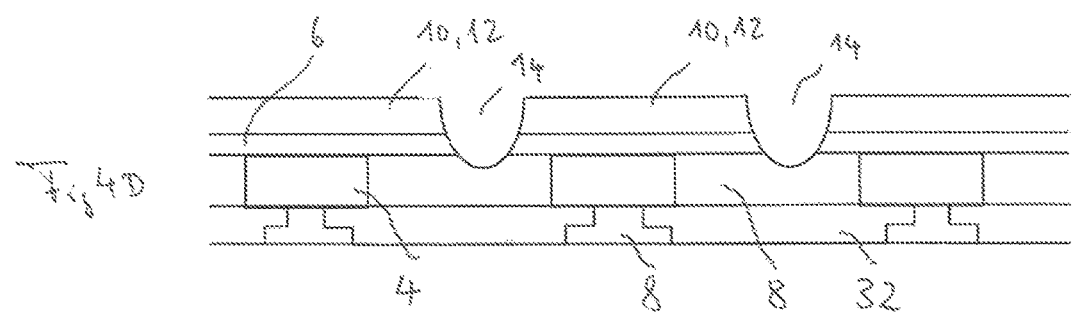

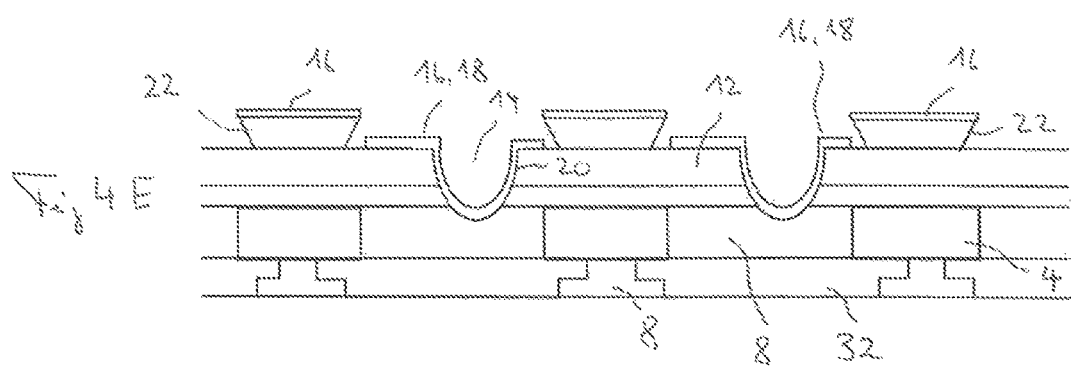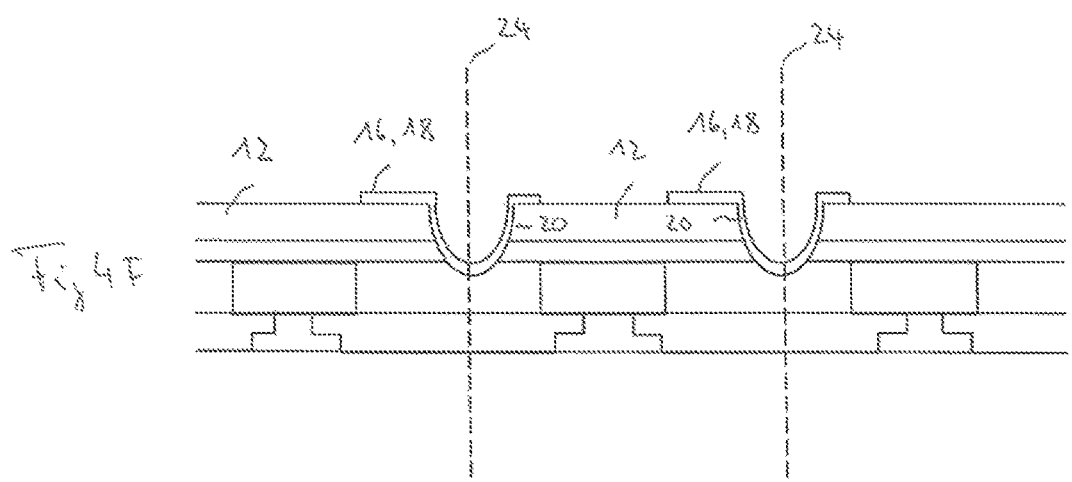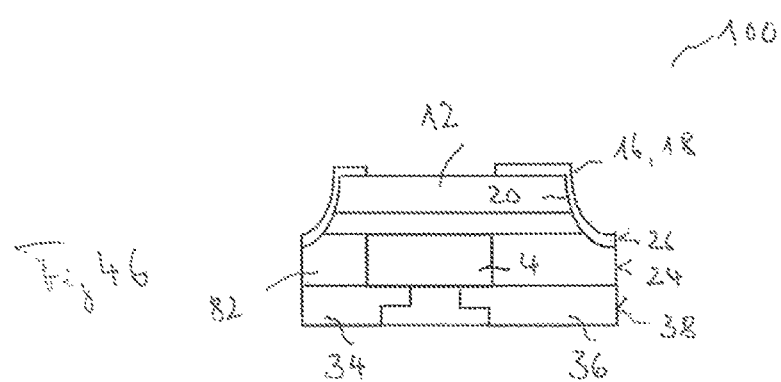

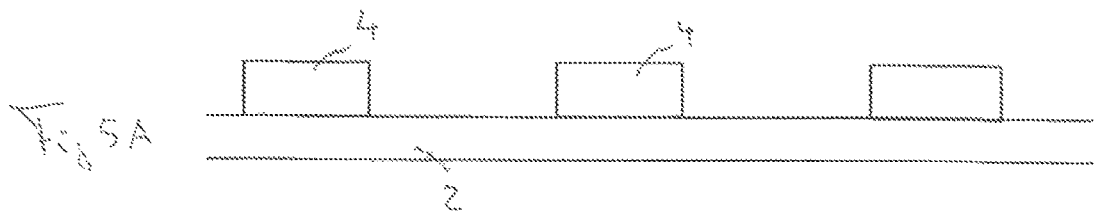
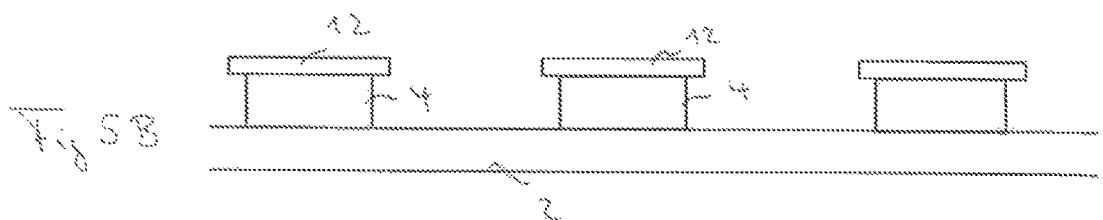
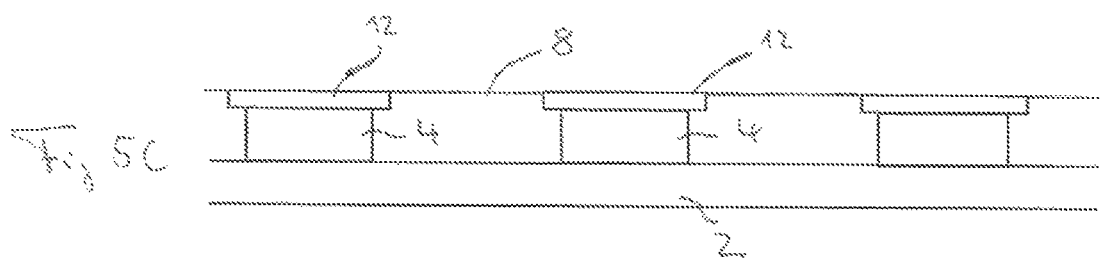
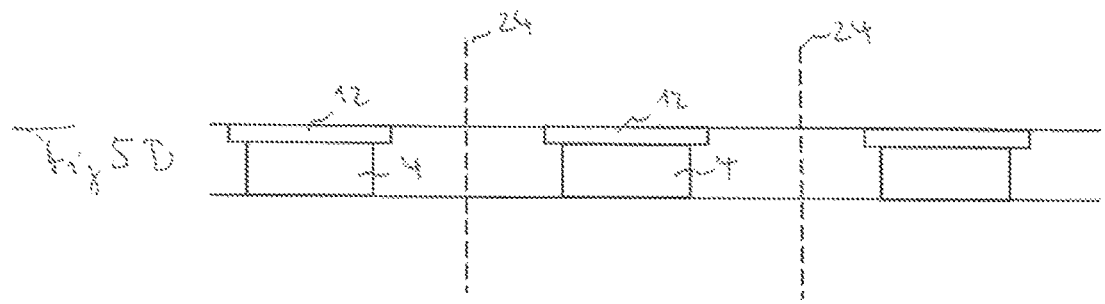
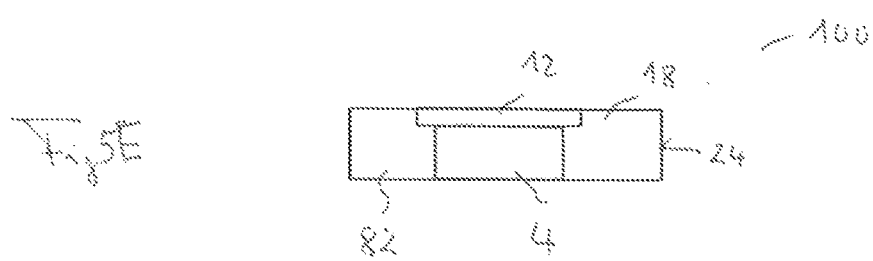

METHOD FOR PRODUCING OPTOELECTRONIC SEMICONDUCTOR DEVICES AND AN OPTOELECTRONIC SEMICONDUCTOR DEVICE

This patent application is a national phase filing under section 371 of PCT/EP2015/072674, filed Oct. 1, 2015, which claims the priority of German patent application 10 2014 114 372.8, filed Oct. 2, 2014, each of which is incorporated herein by reference in its entirety.

TECHNICAL FIELD

Arrangements are known for semiconductor devices such as light-emitting diodes in which the semiconductor chips provided for generating radiation are mounted in prefabricated packages. It is difficult to miniaturize such arrangements to produce particularly compact light-emitting diodes.

BACKGROUND

A solution to this problem, as known from the prior art, consists in forming a package body assembly which is arranged between semiconductor chips arranged in a matrix. The package body assembly may, for example, be produced using a casting method. In a subsequent method step, the package body assembly is singulated into a multiplicity of optoelectronic semiconductor devices, such that each singulated semiconductor device comprises at least one semiconductor chip and one part of the package body assembly as package body. Furthermore, the semiconductor devices produced in this way often comprise conversion elements consisting of a wavelength-converting conversion material.

SUMMARY OF THE INVENTION

Embodiments provide a method for producing an optoelectronic semiconductor device with a conversion element of sensitive conversion material which at the same time is of shallow construction. Further embodiments provide an optoelectronic semiconductor device with a conversion element of sensitive conversion material which has an increased service life.

In various embodiments, a method is provided for producing a multiplicity of optoelectronic semiconductor devices.

According to at least one embodiment of the method, said method comprises a step in which a multiplicity of semiconductor chips intended for generating electromagnetic radiation are provided. The semiconductor chips in particular comprise a semiconductor body with an active region provided for generating electromagnetic radiation. The semiconductor body, in particular the active region, contains, for example, a III-V compound semiconductor material. Furthermore, the semiconductor chip in particular comprises a carrier, on which the semiconductor body is arranged. The carrier is, for example, a growth substrate for the semiconductor layers of the semiconductor body. Alternatively, the carrier is different from a growth substrate for the semiconductor layers of the semiconductor body. In this case, the carrier serves in mechanical stabilization of the semiconductor body, such that the growth substrate is not necessary therefor and may be removed. A semiconductor chip in which the growth substrate has been removed is also known as a thin-film semiconductor chip.

The statement that a layer or an element is arranged or applied "on" or "over" another layer or another element may here and hereinafter mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other.

According to at least one embodiment of the method, said method comprises a step in which the multiplicity of semiconductor chips are arranged in a plane. In this case, the semiconductor chips are spaced from one another in a lateral direction. A lateral direction is here and hereinafter understood to mean a direction parallel to the plane in which the semiconductor chips are arranged. Likewise, a vertical direction is understood to mean a direction perpendicular to said plane.

According to at least one embodiment of the method, said method comprises a step in which a package body assembly is formed, which is arranged at least in part between the semiconductor chips. The package body assembly may in particular be produced using a casting method.

The term casting method here covers all production methods in which a molding composition is introduced into a predetermined mold and in particular is subsequently cured. In particular, the term casting method encompasses casting, injection molding, transfer molding, compression molding and dispensing. The package body assembly is preferably formed by compression molding or by film assisted transfer molding. The package body assembly may, for example, comprise filled or unfilled molding resins (e.g., epoxy resins or silicones). The package body assembly may have a thickness of between 50 µm and 500 µm, preferably of between 100 µm and 200 µm, typically of around 150 µm. The package body assembly is preferably formed by a white material.

According to at least one embodiment of the method, a forming material used in forming the package body assembly is applied in such a way that it covers the side faces of the semiconductor chip and/or the back surfaces of the semiconductor chip in each case at least partly, preferably completely. The semiconductor chips may in this case, for example, be molded over and the package body assembly subsequently thinned, such that the semiconductor chips are exposed in places.

According to at least one embodiment of the method, said method comprises a step in which a multiplicity of conversion elements are provided. Each conversion element comprises a wavelength-converting conversion material and is arranged on one of the semiconductor chips. The conversion elements may be arranged on the semiconductor chips before the package body assembly is formed and optionally even before the time at which they are arranged in a plane, for example, secured to an auxiliary carrier or a structured metal composite.

In this case, a wavelength-converting conversion material is distinguished in that the wavelength of an electromagnetic radiation emitted by the semiconductor chip is converted at the conversion material. The conversion element is hereby configured to convert primary radiation of a first wavelength generated in the semiconductor chips into secondary radiation of a longer wavelength different from the first wavelength. For example, the semiconductor device is provided for generating mixed light, in particular mixed light which appears white to the human eye. For example, blue electromagnetic radiation is converted by the conversion element at least partially or completely into red and/or green radiation.

The conversion element in particular comprises a sensitive wavelength-converting conversion material. A sensitive conversion material is distinguished, for example, in that the conversion material can be destroyed and/or damaged, for example, by oxidation on contact with, for example, oxygen and/or water. Furthermore, the sensitive conversion material may react sensitively to temperature fluctuations and be impaired, for example, in its functionality by such temperature fluctuations.

According to at least one embodiment of the method, said method comprises a step in which the multiplicity of conversion elements are encapsulated at least at the lateral edges thereof with an encapsulation material which differs from the conversion material. The encapsulation material is configured to protect the conversion element from the effects of moisture and oxygen. For example, the encapsulation material may have a water vapor transmission rate which amounts to at most $1\times10^{-3}$ g/m$^2$/day, for example, at most $3\times10^{-4}$ g/m$^2$/day, preferably at most $1\times10^{-6}$ g/m$^2$/day, particularly preferably at most $1\times10^{-8}$ g/m$^2$/day.

According to at least one embodiment of the method, said method comprises a step in which the package body assembly is singulated into a multiplicity of optoelectronic semiconductor devices, wherein each semiconductor device has at least one semiconductor chip, one conversion element and one part of the package body assembly as package body. The package bodies thus arise from the package body assembly only on singulation and therefore at a time when the semiconductor chips are already located in the package body. One consequence of singulation of the package body assembly is that side faces of the resultant optoelectronic semiconductor devices exhibit traces of singulation in the region of the package body.

Complete, tight encapsulation of the conversion elements in the resultant optoelectronic semiconductor devices is advantageously achieved while all or at least most of the production steps are taking place at assembly level, which allows particularly efficient manufacture of the optoelectronic semiconductor devices. At the same time, the resultant optoelectronic semiconductor devices have a particularly shallow and compact design, whereby they are, for example, suitable for use in backlighting apparatuses.

According to at least one embodiment of the method, the conversion material comprises wavelength-converting quantum dots. For example, the conversion element comprises a matrix material, wherein the wavelength-converting quantum dots are introduced into the matrix material.

Through the use of quantum dots as the conversion material, good color rendering is achieved, since the converted electromagnetic radiation is relatively narrowband and thus no mixing of different spectral colors arises. For example, the spectrum of the converted radiation has a wavelength width of at least 20 nm to at most 60 nm. This allows the generation of light whose color may be assigned very precisely to a region of the spectrum. In this way, a large color gamut may be achieved when using the optoelectronic semiconductor device in a backlighting apparatus.

The quantum dots are preferably nanoparticles, i.e., particles with a size in the nanometer range. The quantum dots comprise a semiconductor core, which has wavelength-converting characteristics. The semiconductor core may, for example, be formed with CdSe, CdS, InAs, CuInS$_2$, ZnSe (for example, Mn-doped) and/or InP and, for example, doped. For applications with infrared radiation, the semiconductor core may, for example, be formed with CdTe, PbS, PbSe and/or GaAs and likewise, for example, doped. The semiconductor core may be encased in a plurality of layers. In other words, the semiconductor core may be completely or almost completely covered by further layers at its outer faces.

A first encasing layer of a quantum dot is, for example, formed with an inorganic material, such as, for example, ZnS, CdS and/or CdSe, and serves in creation of the quantum dot potential. The first encasing layer and the semiconductor core are almost completely enclosed at the exposed outer faces by at least one second encasing layer. The second layer may, for example, be formed with an organic material, such as, for example, cystamine or cysteine, and may serve to improve the solubility of the quantum dots in, for example, a matrix material and/or a solvent (amines, and sulfur-containing or phosphorus-containing organic compounds may also be used). In this case, it is possible for a spatially uniform distribution of the quantum dots in a matrix material to be improved as a result of the second encasing layer.

According to at least one embodiment of the method, the multiplicity of conversion elements arises through singulation from a conversion foil comprising the conversion material. The conversion foil preferably comprises two barrier layers, between which the conversion material is arranged and which ensure protection from the effects of moisture and oxygen. In this case it is sufficient to provide the conversion elements arising through singulation at their lateral edges, i.e., in the regions in which the conversion foil was cut through (and thereby opened) and in which the conversion material is exposed and unprotected, with an encapsulation by which, together with the barrier layers, sufficient protection of the conversion material from all sides is ensured.

According to at least one embodiment of the method, provision is made for the conversion foil to be secured on the package body assembly and the semiconductor chips. The conversion foil may, for example, be adhesively bonded on or alternatively laminated on using a silicone or a hybrid polymer. Only after securing is the conversion foil cut through to form the conversion elements. This may be achieved in that trenches are introduced into the conversion foil, which define the conversion elements which are here formed on the semiconductor chips. Then the conversion elements are encapsulated with the encapsulation material, for example, at least in the region of the trenches, i.e., at lateral edges of the conversion elements arising through singulation. Encapsulation preferably proceeds shortly (for example, within an hour, preferably within 30 minutes) after formation of the trenches, in order to prevent significant damage to the conversion material.

The purpose of formation of the conversion elements through the introduction of trenches into the conversion foil is suitably to define the radiation exit face in the subsequently produced semiconductor device and to increase the efficiency of the device.

According to at least one embodiment of the method, provision is made for the conversion elements to be encapsulated using a coating method. Encapsulation may proceed, for example, by way of atomic layer deposition (ALD) and/or chemical vapor deposition (CVD) and/or sputtering. Chemical vapor deposition may also be plasma-enhanced. The following may, for example, be used as encapsulation material: $Al_2O_3$, $SiO_2$, $ZrO_2$, $TiO_2$, $Si_3N_4$, siloxane and/or $SiO_xN_y$. The use of a parylene is also possible. Other organic or inorganic materials or combinations thereof may also be used. The encapsulation material may be a reflective, preferably a non-metallic reflective material, for example, a white plastics material such as white epoxide, or comprise one of said materials.

According to at least one embodiment of the method, provision is made for the conversion elements to be encapsulated using a casting method. The term casting method covers all the above-stated production methods in which a molding composition is introduced into a predetermined mold.

According to at least one embodiment of the method, provision is made for the conversion foil firstly to be singulated into conversion elements and the conversion elements to be formed on the semiconductor chips. Singulation of the conversion foil into conversion elements may take place either before or after securing of the conversion foil/conversion elements to the semiconductor chips. Only then is the package body assembly formed. In this case, it is preferable for the package body assembly to encapsulate the multiplicity of conversion elements at least at the lateral edges thereof. Encapsulation thus proceeds during formation of the package body assembly, for example, during the (preferably film assisted) casting method used for this purpose. The encapsulation material in this case preferably comprises an epoxy resin.

According to at least one embodiment of the method, said method comprises a step in which an auxiliary carrier is provided. The auxiliary carrier may be of flexible construction, for example, in the form of a film, or rigid.

According to at least one embodiment of the method, said method comprises a step in which the multiplicity of semiconductor chips are secured to the auxiliary carrier. The optoelectronic semiconductor chips are spaced from one another in a lateral direction. The lateral direction in this case coincides with a main plane of extension of the auxiliary carrier. For example, the auxiliary carrier may take the form of an adhesive film to which the semiconductor chips adhere. However, the multiplicity of semiconductor chips does not necessarily have to be arranged directly on the auxiliary carrier. It is sufficient for the semiconductor chips to be arranged, for example, on an adhesive layer which covers the auxiliary carrier, such that they are mounted at least indirectly on the auxiliary carrier.

According to at least one embodiment of the method, said method comprises a step in which the auxiliary carrier is removed, for example, by being delaminated. This preferably takes place directly after formation of the package body assembly, but may also take place at a later point.

According to at least one embodiment of the method, the conversion foil is secured to the package body assembly and the semiconductor chips after removal of the auxiliary carrier. The conversion foil is preferably formed on a side of the package body assembly on which the auxiliary carrier was arranged before removal thereof. That is to say, the conversion foil substantially takes the place of the auxiliary carrier.

According to at least one embodiment of the method, said method comprises a step in which the multiplicity of semiconductor chips are secured to a structured metal composite. The optoelectronic semiconductor chips are spaced from one another in a lateral direction. The lateral direction in this case coincides with a main plane of extension of the structured metal composite. After singulation of the package body assembly into the multiplicity of optoelectronic semiconductor devices, each semiconductor device then comprises at least one part of the structured metal composite as leadframe.

According to at least one embodiment of the method, the conversion elements are additionally encapsulated at the front surface thereof with the encapsulation material, wherein the encapsulation material is transparent. Here and hereinafter, the front surface of a conversion element is understood to mean that side which is remote from the semiconductor chip connected to the conversion element. The back surface of a semiconductor chip is conversely understood to mean the side of the semiconductor chip which is remote from the conversion element.

According to at least one embodiment, an optoelectronic semiconductor device comprises a semiconductor chip provided for generating electromagnetic radiation.

According to at least one embodiment of the optoelectronic semiconductor device, the semiconductor device comprises a package body which surrounds the semiconductor chip in a lateral direction.

According to at least one embodiment of the optoelectronic semiconductor device, a conversion element is arranged on the semiconductor chip, which conversion element comprises a wavelength-converting conversion material. An encapsulation consisting of an encapsulation material which differs from the conversion material is provided at at least one lateral edge of the conversion element. The encapsulation may, for example, comprise a metal layer, in particular a reflective metal layer, an absorbing or a non-metallic reflective layer.

According to at least one embodiment of the optoelectronic semiconductor device, side faces of the package body exhibit traces of singulation.

According to at least one embodiment of the optoelectronic semiconductor device, at least one side face of the encapsulation and at least one side face of the package body terminate flush with one another.

According to at least one embodiment of the optoelectronic semiconductor device, the semiconductor device comprises on a back surface two contacts for contacting the semiconductor chip. The back surface of the semiconductor device is understood to mean the side of the semiconductor device which corresponds to the back surface of the semiconductor chip.

According to at least one embodiment of the optoelectronic semiconductor device, the semiconductor device additionally comprises a leadframe. The two contacts are preferably formed on the back surface of the semiconductor device by parts of the leadframe.

According to at least one embodiment of the optoelectronic semiconductor device, the leadframe is exposed in places on at least one side face of the semiconductor device.

The above-described method for producing optoelectronic semiconductor devices is particularly suitable for producing the optoelectronic semiconductor device. Features listed in connection with the method may therefore also be used for the semiconductor device or vice versa.

BRIEF DESCRIPTION OF THE DRAWINGS

Further features, configurations and convenient aspects are revealed by the following description of the exemplary embodiments in conjunction with the figures.

Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

In the figures:

FIGS. 1A to 1I, 2A to 2C, 3A to 3C, 4A to 4G and 5A to 5E each show an exemplary embodiment of a method for producing optoelectronic semiconductor devices on the basis of intermediate steps shown in each case in schematic sectional view.

FIGS. 1A to 1I show a first exemplary embodiment of a method for producing a multiplicity of optoelectronic semiconductor devices.

DETAILED DESCRIPTION OF ILLUSTRATIVE EMBODIMENTS

Figure 1A:
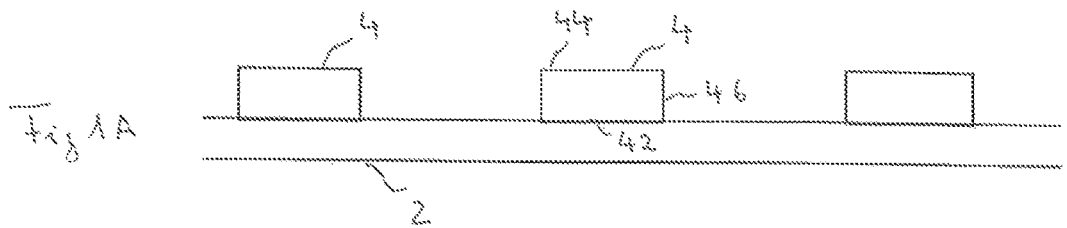

As shown in FIG. 1A, first of all an auxiliary carrier 2 is provided. A self-adhesive film is, for example, suitable for the auxiliary carrier 2. Alternatively, the semiconductor chips may also be secured by means of a temporary adhesive. In the method step shown in FIG. 1A, a multiplicity of semiconductor chips 4 are secured directly to the auxiliary carrier 2. The semiconductor chips 4 are arranged in a matrix and are spaced from one another in a lateral direction, i.e., in a direction parallel to the main plane of extension of the auxiliary carrier 2. The subsequent description is given for electromagnetic radiation-emitting semiconductor devices. The semiconductor chips are, for example, luminescent diode semiconductor chips, for instance light-emitting diode semiconductor chips.

In a vertical direction, the semiconductor chips 4 extend between a front surface 42 and a back surface 44. Moreover, the semiconductor chips 4 comprise side faces 46. The semiconductor chips 4 are arranged in such a way on the auxiliary carrier 2 that the front surface 42 faces the auxiliary carrier 2.

In the following method step shown in FIG. 1B, a package body assembly 8 is produced by compression molding which fills the regions between adjacent semiconductor chips 4.

Figure 1B:
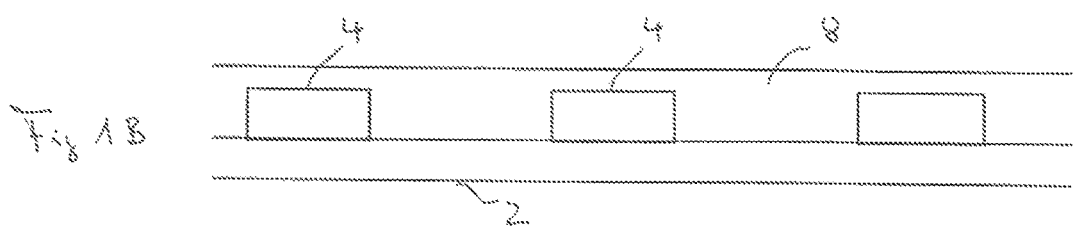
Figure 1C:
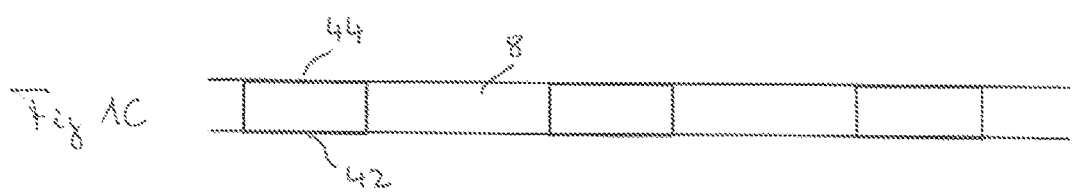

In the subsequent method step shown in FIG. 1C, the package body assembly 8 is thinned from the side remote from the auxiliary carrier 2, for example, by means of a mechanical method such as grinding, such that the back surfaces 44 of the semiconductor chips are exposed. Furthermore, the auxiliary carrier 2 is removed by delamination, such that the front surfaces 42 of the semiconductor chips are also exposed.

Figure 1D:
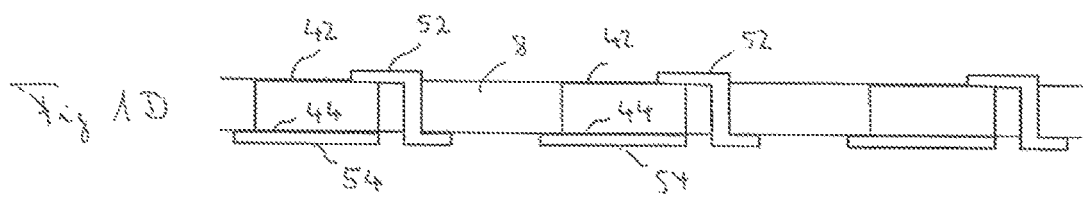

Because the semiconductor chips 4 are exposed in the regions of their back surfaces 44, it is possible to contact the semiconductor chips from the back thereof. FIG. 1D shows by way of example front surface contacts 52 and back surface contacts 54 which are capable of supplying the semiconductor chips 4 with electrical current. For better graphical representation, the structure shown in FIG. 1C has been rotated through 180° in FIG. 1D. In the subsequent semiconductor device both the front surface contacts 52 and the back surface contacts 54 are accessible from the back thereof for contacting.

Figure 1E:
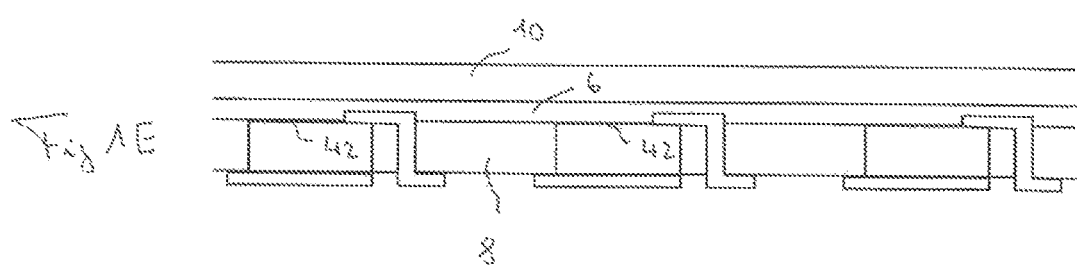

In FIG. 1E the removed auxiliary carrier is replaced by a conversion foil 10, which is adhesively bonded to the front surfaces 42 of the semiconductor chips and the package body assembly 8 using an adhesive 6 consisting in the present case of silicone. Alternatively, the conversion foil 10 may in turn comprise an adhesive layer and be secured thereby to the front surfaces 42 of the semiconductor chips and the package body assembly 8 (not shown).

In the following method step shown in FIG. 1F, the conversion foil 10 is cut through to form conversion elements 12, trenches 14 being introduced into the conversion foil 10 which define the conversion elements 12. The trenches 14 extend in the present case through the conversion foil 10 and the silicone adhesive 6 into the package body assembly 8 and thus cut right through the conversion foil 10.

A metal coating 16 is then formed, which covers the conversion elements 12 and the trenches 14, wherein a photoresist 22 is applied beforehand to the regions of the conversion elements 12 which are exposed in the finished semiconductor devices and are intended to serve as radiation exit faces (see FIG. 1G). The metal coating 16 thus forms an encapsulation 18 in the region of the trenches 14, i.e., at lateral edges 20 of the conversion elements 12, which encapsulation protects the latter from the effects of air and moisture.

Formation of the metal coating 16 preferably proceeds shortly (for example, within an hour, preferably within 30 minutes) after formation of the trenches 14, in order to prevent significant damage to the conversion material.

The photoresist 22 applied in places is then removed using a suitable solvent, such that the metal coating 16 only remains in those regions in which it is desired as encapsulation 18 (see FIG. 1H). For singulation into semiconductor devices 100, the package body assembly 8 is cut through along singulation lines 24. This may, for example, proceed mechanically, for instance by means of sawing, chemically, for example, by means of etching, and/or by means of coherent radiation, for instance by laser ablation.

Each of the resultant semiconductor devices 100 comprises at least one semiconductor chip 4, one conversion element 12 with lateral encapsulation 18 and one part of the package body assembly as package body 82 (see FIG. 1I). Moreover, the optoelectronic semiconductor device 100 comprises on its back surface two contacts 52, 54 for contacting the semiconductor chip 4.

A consequence of singulation of the package body assembly is that side faces 24 of the package body 82 and side faces 26 of the encapsulation 18 exhibit traces of singulation. Furthermore, the side faces 26 of the encapsulation 18 and the side faces 24 of the package body 82 terminate flush with one another.

Figure 2A:
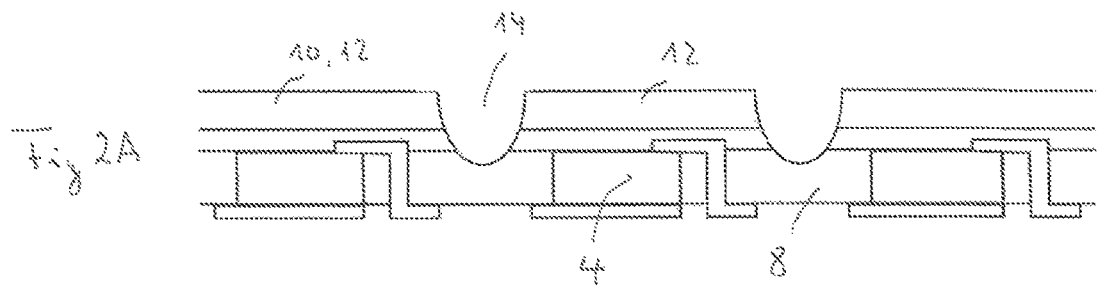

The exemplary embodiment shown in FIGS. 2A to 2C corresponds substantially to the exemplary embodiment described in connection with FIGS. 1A to 1I. FIG. 2A here corresponds to FIG. 1F. All the method steps which are performed prior to the step shown in FIG. 1F correspond in the two exemplary embodiments.

Figure 2B:
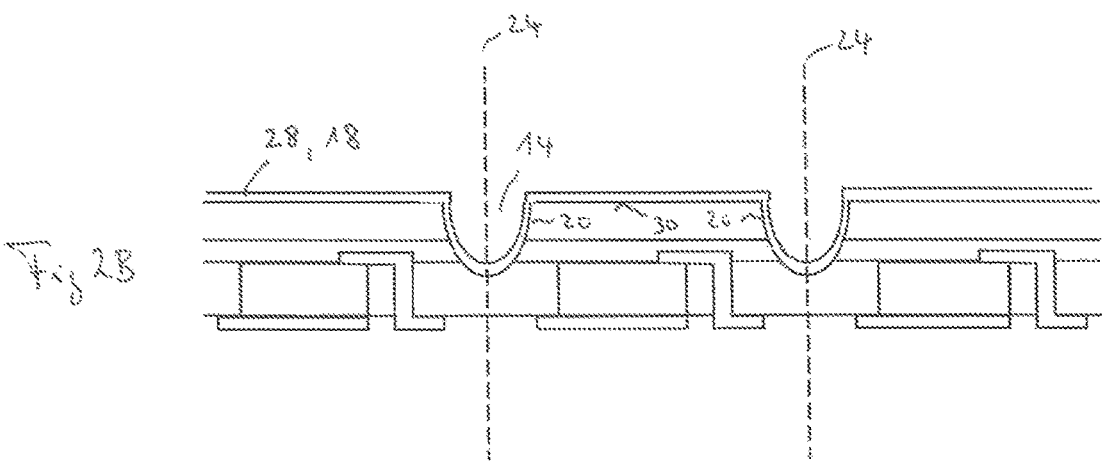

In contrast with the method step illustrated in FIG. 1G, in the present case a transparent coating is here formed of parylene 28 (for example, by free-radically initiated polymerization), which covers the conversion elements 12 and the trenches 14 (see FIG. 2B). The coating of parylene 28 forms an encapsulation 18 not only in the region of the trenches 14, i.e., at lateral edges 20 of the conversion elements 12, but also over the entire front face 30 of the conversion elements 12, which encapsulation protects the latter from the effects of air and moisture. Instead of the parylene, a coating may also be formed of other materials, for example, by ALD or CVD.

Figure 2C:
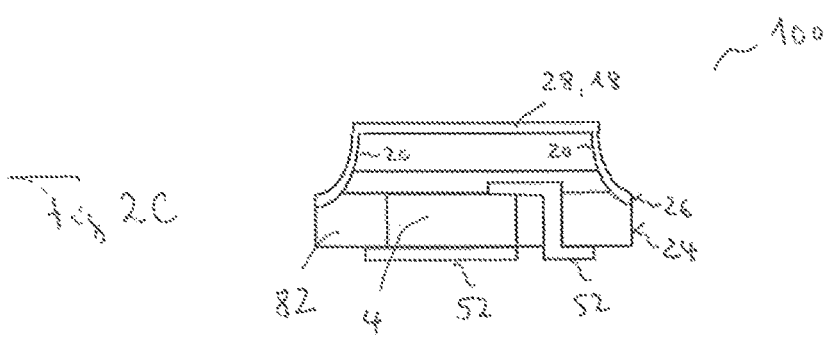

Once again, side faces 24 of the package body 82 and side faces 26 of the encapsulation 18 exhibit traces of singulation in the finished semiconductor device 100 (see FIG. 2C).

Furthermore, the side faces 26 of the encapsulation 18 and the side faces 24 of the package body 82 terminate flush with one another.

The exemplary embodiment shown in FIGS. 3A to 3C likewise corresponds substantially to the exemplary embodiment described in connection with FIGS. 1A to 1I. FIG. 3A here corresponds to FIG. 1F. All the method steps which are performed prior to the step shown in FIG. 1F correspond in the two exemplary embodiments.

In contrast with the method step shown in FIG. 1G, in this case the trenches 14 are casted with the same material as was used during previous formation of the package body assembly 8 in the method step shown in FIG. 1B (see FIG. 3B). That is to say, the package body assembly 8 is extended in such a way that it now extends through the trenches 14 to the front surface of the overall assembly shown in FIG. 3B. The package body assembly 8, and subsequently also the package body 82 of the singulated semiconductor device 100, forms an encapsulation 18 in the region of the trenches 14, i.e., at lateral edges 20 of the conversion elements 12, which protects the latter from the effects of air and moisture. The side faces 24 of the package body 82 again exhibit traces of singulation (see FIG. 3C).

FIGS. 4A to 4G show a further exemplary embodiment of a method for producing a multiplicity of optoelectronic semiconductor devices, which substantially corresponds to the exemplary embodiment described in connection with FIGS. 1A to 1I but in which no auxiliary carrier is used.

In the method step shown in FIG. 4A, a multiplicity of semiconductor chips 4 are in this case secured to a structured metal composite 32. The semiconductor chips 4, which here take the form of flip chips, are arranged in a matrix and in a lateral direction, i.e., are spaced from one another in a direction parallel to the main plane of extension of the structured metal composite 32. The structured metal composite 32 is obtained from a metal layer which is cut through in places, such that a multiplicity of island-like metal structures are formed. The semiconductor chips 4 are preferably secured to the structured metal composite 32 in such a way that they are each arranged on two adjacent island-like metal structures.

In the following method step shown in FIG. 4B a package body assembly 8 is again produced which fills the regions between adjacent semiconductor chips 4 and between the adjacent island-like metal structures. Furthermore, the package body assembly 8 is thinned, such that the front surfaces 42 of the semiconductor chips 4 are exposed.

In the following method step shown in FIG. 4C, as in FIG. 1E a conversion foil 10 is adhesively bonded to the front surfaces 42 of the semiconductor chips and to the package body assembly 8 using an adhesive 6 consisting of silicone.

The method steps shown in FIG. 4D to 4F correspond substantially to the steps shown in FIGS. 1F to 1H.

In the method step shown in FIG. 4D, the conversion foil 10 is again cut through to form conversion elements 12, in that trenches 14 are introduced into the conversion foil 10 which define the conversion elements 12. Then a metal coating 16 is formed (see FIG. 4E), which covers the conversion elements 12 and the trenches 14, wherein a photoresist 22 is applied beforehand to the regions of the conversion elements 12 which are exposed in the finished semiconductor devices and are intended to serve as radiation exit faces. The metal coating 16 thus forms an encapsulation 18 in the region of the trenches 14, i.e., at lateral edges 20 of the conversion elements 12, which encapsulation protects the latter from the effects of air and moisture.

The photoresist 22 applied in places is in turn removed using a suitable solvent, such that the metal coating 16 only remains in those regions in which it is desired as encapsulation 18 (see FIG. 4F). For singulation into semiconductor devices 100, the package body assembly 8 is divided along singulation lines 24.

Each of the resultant semiconductor devices 100 comprises at least one semiconductor chip 4, one conversion element 12 with lateral encapsulation 18 and one part of the package body assembly as package body 82 (see FIG. 4G). Moreover, the optoelectronic semiconductor device 100 comprises two leadframes 34, 36, which are suitable for contacting the semiconductor chip 4 from the back of the semiconductor device and which arise through division of the structured metal composite 32 on singulation.

A consequence of singulation of the package body assembly is that side faces 24 of the package body 82 and side faces 26 of the encapsulation 18 and, in the present exemplary embodiment, also side faces 38 of the two leadframes 34 36, exhibit traces of singulation. Furthermore, the side faces 26 of the encapsulation 18, the side faces 24 of the package body 82 and the side faces 38 of the two leadframes 34, 36 terminate flush with one another.

FIGS. 5A to 5E show a further exemplary embodiment of a method for producing a multiplicity of optoelectronic semiconductor devices.

As shown in FIG. 5A, a multiplicity of semiconductor chips 4 are again secured directly to an auxiliary carrier 2. Unlike in the preceding exemplary embodiments, first of all a conversion foil, not shown, is singulated into conversion elements 12, which are secured to the semiconductor chips 4 (see FIG. 5B). Singulation of the conversion foil into conversion elements 12 may take place either before or after securing of the conversion foil/conversion elements to the semiconductor chips 4.

In the subsequent method step shown in FIG. 5C, a package body assembly 8 is produced, which assembly not only fills in the regions between adjacent semiconductor chips 4 but also the regions between adjacent conversion elements 12 and encapsulates the latter at the lateral edges 20 thereof. Encapsulation thus proceeds during formation of the package body assembly 8. The front surfaces of the conversion elements 12 are already exposed and are not covered by the package body assembly 8. There is therefore no need to thin the package body assembly 8 from the side remote from the auxiliary carrier 2.

In the subsequent method step shown in FIG. 5D, the auxiliary carrier 2 is removed by delamination. For singulation into semiconductor devices 100, the package body assembly 8 is again divided along singulation lines 24.

Each of the resultant semiconductor devices 100 comprises at least one semiconductor chip 4, one conversion element 12 and one part of the package body assembly as package body 82, which at the same time forms a lateral encapsulation 18 for the conversion elements 12 (see FIG. 5E). A consequence of the singulation of the package body assembly is again that side faces 24 of the package body 82 exhibit traces of singulation.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A method for producing a plurality of optoelectronic semiconductor devices, the method comprising:
   a) providing a plurality of semiconductor chips for generating electromagnetic radiation;
   b) arranging the plurality of semiconductor chips in a plane, wherein the semiconductor chips are spaced from one another in a lateral direction;
   c) forming a package body assembly arranged at least in part between the semiconductor chips;
   d) forming a plurality of conversion elements, wherein each conversion element comprises a wavelength-converting conversion material and is arranged on one of the semiconductor chips;
   e) encapsulating the plurality of conversion elements at least at lateral edges thereof with an encapsulation material which differs from the conversion material; and
   f) singulating the package body assembly into the plurality of optoelectronic semiconductor devices,
   wherein each semiconductor device comprises at least one semiconductor chip, one laterally encapsulated conversion element and one part of the package body assembly as a package body,
   wherein step d) is performed before step b), before step c) or before step e), and
   wherein the semiconductor chips are molded over in step c) and the package body assembly is then thinned such that the semiconductor chips are exposed in places.

2. The method according to claim 1, wherein the conversion material comprises wavelength-converting quantum dots.

3. The method according to claim 2, wherein the plurality of conversion elements are formed by singulating a conversion foil, which comprises the conversion material.

4. The method according to claim 3, wherein the conversion foil is secured to the package body assembly and the semiconductor chips and is then cut through by trenches in such a way that one conversion element is formed on each semiconductor chip, and wherein the conversion elements are encapsulated with the encapsulation material at least in regions of the trenches.

5. The method according to claim 4, wherein the conversion elements are encapsulated by a coating process or by a casting process.

6. The method according to claim 3, wherein first the conversion foil is singulated into conversion elements and the conversion elements are formed on the semiconductor chips, and wherein the package body assembly is then formed in such a way that it encapsulates the plurality of conversion elements at least at the lateral edges.

7. The method according to claim 2, wherein, in step b), the plurality of semiconductor chips are secured to an auxiliary carrier, wherein the semiconductor chips are spaced from one another in a lateral direction, and wherein the auxiliary carrier is removed after step c) or after a subsequent method step.

8. The method according to claim 2, wherein, in step b), the plurality of semiconductor chips are secured to a structured metal composite, and wherein, once step f) has been performed, each semiconductor device comprises at least one part of the structured metal composite as leadframe.

9. The method according to claim 2, wherein the conversion elements are encapsulated on a front surface thereof with the encapsulation material, and wherein the encapsulation material is transparent.

10. The method according to claim 1, wherein the package body assembly is formed in step c) by compression molding or by film assisted transfer molding.

11. An optoelectronic semiconductor device comprising:
    a semiconductor chip configured to generate electromagnetic radiation;
    a package body surrounding the semiconductor chip in a lateral direction;
    a conversion element comprising a wavelength-converting conversion material, wherein the conversion element is arranged on the semiconductor chip;
    an encapsulation arranged at least at a lateral edge of the conversion element, wherein the encapsulation comprises an encapsulation material which differs from the conversion material;
    side faces of the package body exhibiting traces of singulation; and
    two contacts on a back surface for contacting the semiconductor chip,
    wherein the conversion element is a singulated part of a conversion foil comprising the conversion material, and
    wherein the conversion element covers in top view an electromagnetic radiation emitting surface of the semiconductor chip, the contacts and partially the package body without covering the side faces of the package body.

12. The optoelectronic semiconductor device according to claim 11, wherein at least one side face of the encapsulation and at least one side face of the package body terminate flush with one another.

13. The optoelectronic semiconductor device according to claim 11, further comprising a leadframe, wherein the two contacts are formed on the back surface of the semiconductor device by parts of the leadframe, and wherein the leadframe is exposed in places at least one side face of the semiconductor device.

14. A method for producing a plurality of optoelectronic semiconductor devices, the method comprising:
    a) providing a plurality of semiconductor chips for generating electromagnetic radiation;
    b) arranging the plurality of semiconductor chips in a plane, wherein the semiconductor chips are spaced from one another in a lateral direction;
    c) forming a package body assembly arranged at least in part between the semiconductor chips;
    d) forming a plurality of conversion elements, wherein each conversion element comprises a wavelength-converting conversion material and is arranged on one of the semiconductor chips;
    e) encapsulating the plurality of conversion elements at least at lateral edges thereof with an encapsulation material which differs from the conversion material; and
    f) singulating the package body assembly into the plurality of optoelectronic semiconductor devices, wherein each semiconductor device comprises at least one semiconductor chip, one laterally encapsulated conversion element and one part of the package body assembly as package body, wherein step d) is performed before step b), before step c) or before step e), and wherein the plurality of conversion elements are formed by singulating a conversion foil, which comprises the conversion material.

15. The method according to claim 14, wherein the conversion foil is secured to the package body assembly and the semiconductor chips and is then cut through by trenches in such a way that one conversion element is formed on each semiconductor chip, and wherein the conversion elements are encapsulated with the encapsulation material at least in regions of the trenches.

* * * * *